(12) United States Patent
Tsukada et al.

(10) Patent No.: US 6,358,630 B1
(45) Date of Patent: Mar. 19, 2002

(54) SOLDERING MEMBER FOR PRINTED WIRING BOARDS

(75) Inventors: Kiyotaka Tsukada; Hiroyuki Kobayashi; Yoshikazu Ukai; Kenji Chihara; Yoshihide Tohyama; Yasuyoshi Okuda; Yoshihiro Kodera, all of Ohgaki (JP)

(73) Assignee: Ibiden Co., Ltd., Ohgaki (JP)

( * ) Notice: Subject to any disclaimer, the term of this patent is extended or adjusted under 35 U.S.C. 154(b) by 0 days.

(21) Appl. No.: 09/424,582

(22) PCT Filed: Jun. 2, 1998

(86) PCT No.: PCT/JP98/02437

§ 371 Date: Nov. 26, 1999

§ 102(e) Date: Nov. 26, 1999

(87) PCT Pub. No.: WO98/56217

PCT Pub. Date: Oct. 12, 1998

(30) Foreign Application Priority Data

| Jun. 4, 1997 | (JP) | 9-163337 |
| Jul. 14, 1997 | (JP) | 9-205314 |
| Sep. 25, 1997 | (JP) | 9-279805 |
| Sep. 25, 1997 | (JP) | 9-279806 |
| Sep. 25, 1997 | (JP) | 9-279807 |
| Sep. 26, 1997 | (JP) | 9-279642 |
| Sep. 26, 1997 | (JP) | 9-279643 |
| Sep. 26, 1997 | (JP) | 9-279644 |

(51) Int. Cl.[7] .......... B32B 15/01; B32B 15/02; B32B 15/20
(52) U.S. Cl. .......... 428/646; 428/548; 428/645; 428/670; 428/674; 428/680; 75/255; 219/85.1; 219/129
(58) Field of Search .......... 428/548, 570, 428/680, 645, 646, 670, 674; 75/255; 219/85.1, 129, 616; 420/558, 560, 570, 573, 574

(56) References Cited

U.S. PATENT DOCUMENTS

| 4,941,929 A | * | 7/1990 | Tecle | 148/24 |
| 5,008,998 A | * | 4/1991 | Higuchi et al. | 29/840 |
| 5,877,560 A | * | 3/1999 | Wen et al. | 257/778 |
| 6,022,758 A | * | 2/2000 | Badehi | 438/108 |

FOREIGN PATENT DOCUMENTS

| JP | 3-95636 | 9/1991 |
| JP | 3-204194 | 9/1991 |
| JP | 3-209734 | 9/1991 |
| JP | 3-291991 | 12/1991 |
| JP | 4-154136 | 5/1992 |
| JP | 5-206620 | 8/1993 |
| JP | 6-268015 | 9/1994 |
| JP | 7-7243 | 1/1995 |
| JP | 7-235565 | 9/1995 |
| JP | 7-249632 | 9/1995 |
| JP | WO 95/24113 | 9/1995 |
| JP | 8-57681 | 3/1996 |
| JP | 8-139097 | 5/1996 |
| JP | 8-153727 | 6/1996 |
| JP | 8-174266 | 7/1996 |
| JP | 8-191073 | 7/1996 |
| JP | 8-192291 | 7/1996 |

\* cited by examiner

*Primary Examiner*—Deborah Jones
*Assistant Examiner*—Andrew T. Piziali
(74) *Attorney, Agent, or Firm*—Oliff & Berridge, PLC

(57) ABSTRACT

This invention relates to a solder member for external connection joined to a connection terminal formed on a surface of a printed wiring board corresponding to a conductor pattern and having an electroless Ni/Au plated layer, wherein the solder member is a ball-shaped solder containing finely powdered copper and has an excellent joint strength to the connection terminal.

4 Claims, 9 Drawing Sheets

FIG_1

FIG. 2
(a) 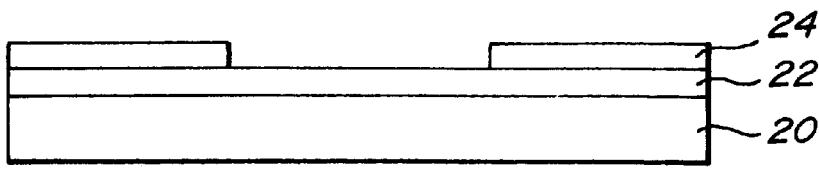
(b) 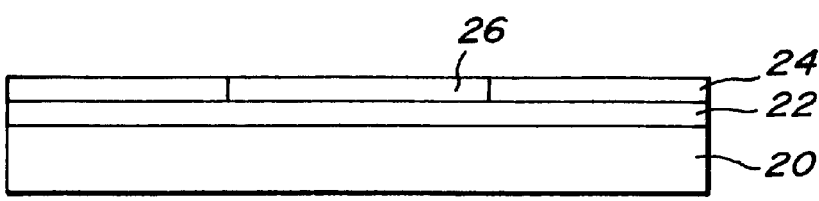
(c) 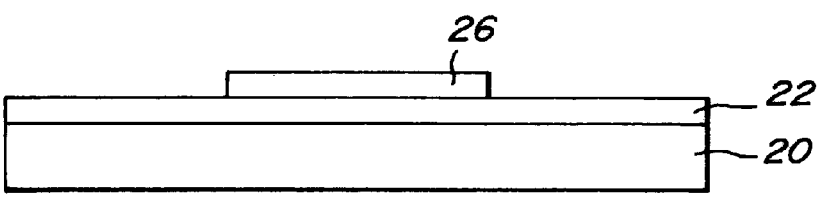
(d) 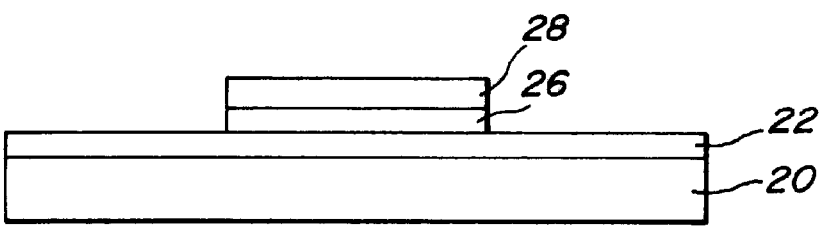
(e) 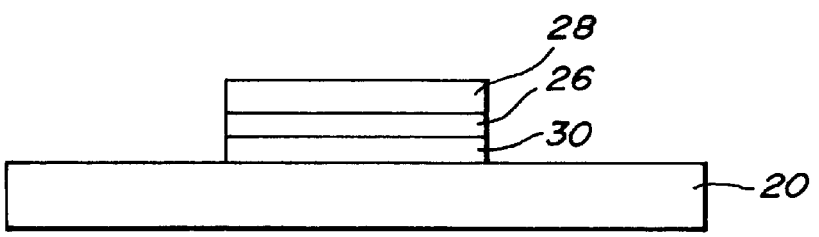
(f) 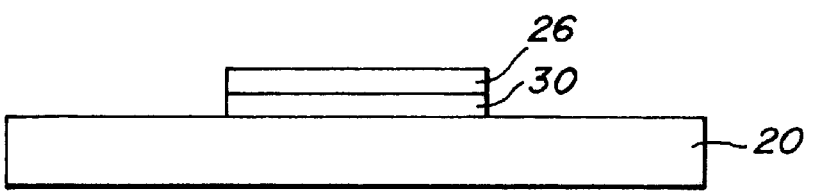

FIG_4
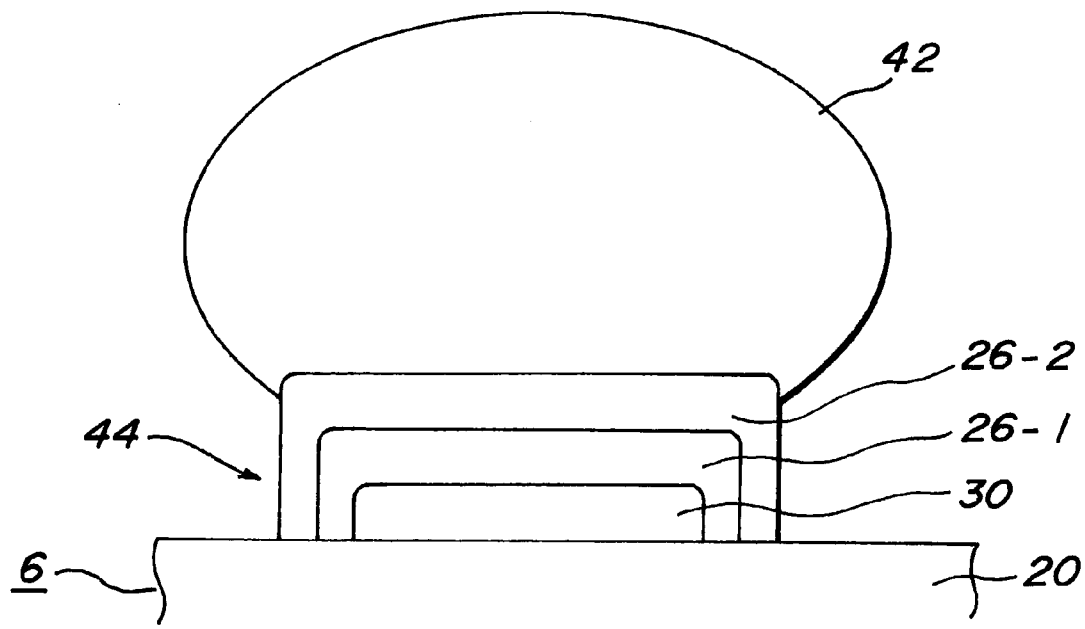
FIG_5
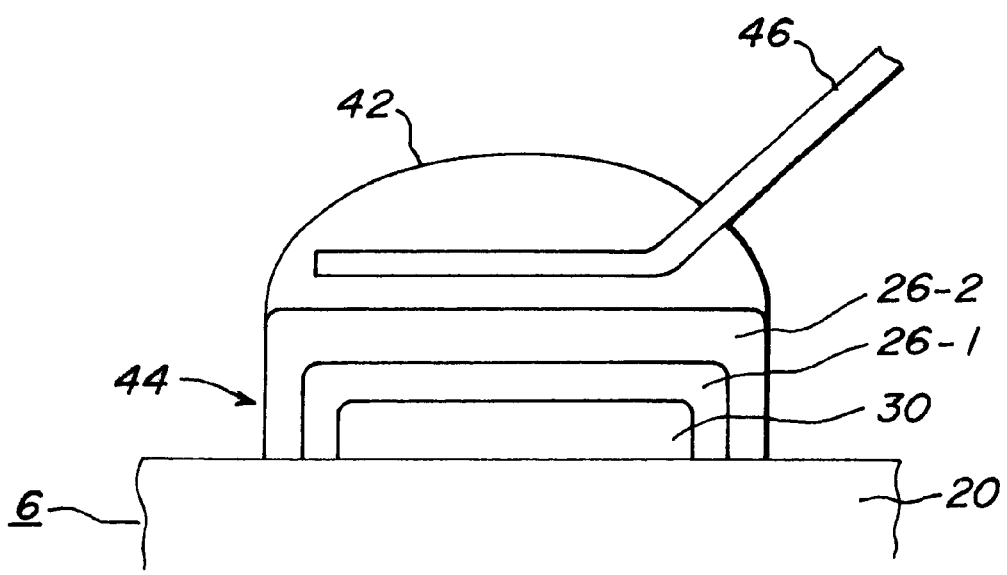

FIG_6
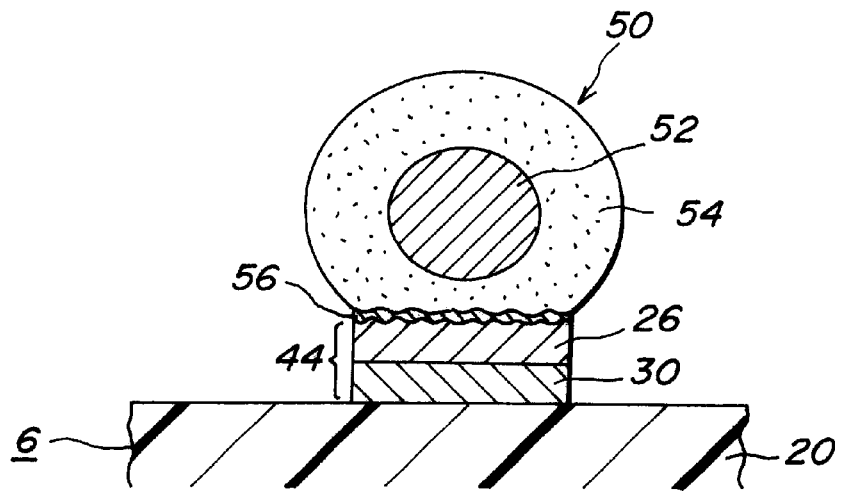
FIG_7
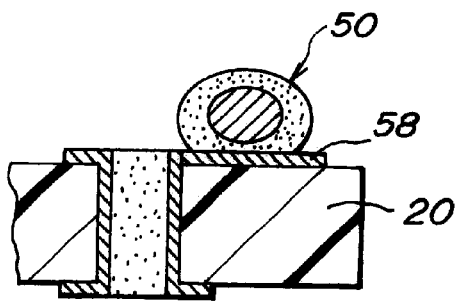
FIG_8
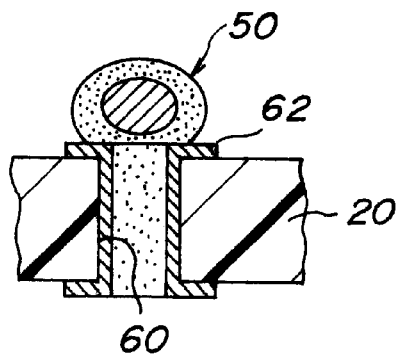

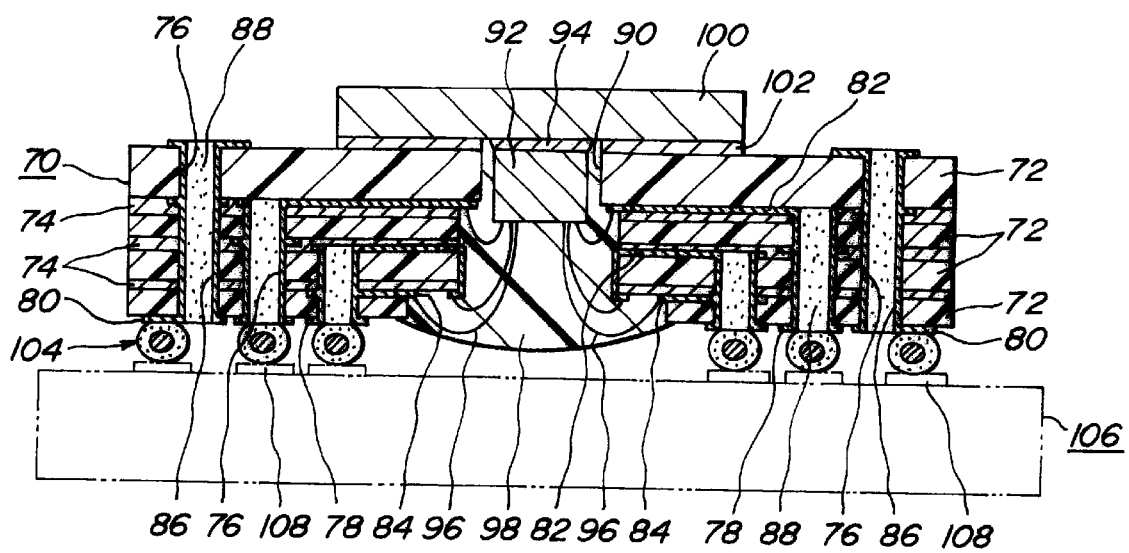
FIG_9
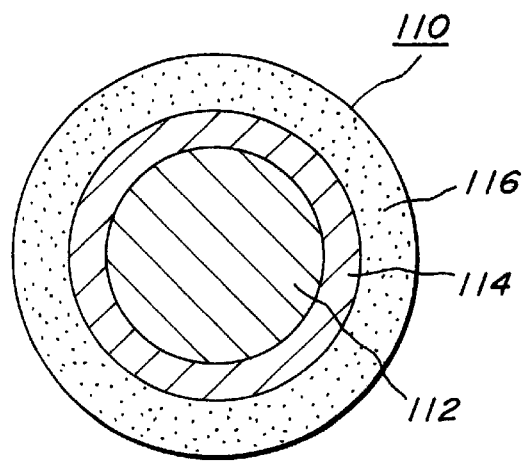
FIG_10

FIG_12
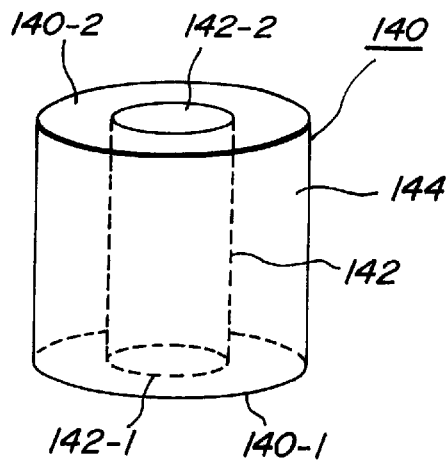
FIG_13
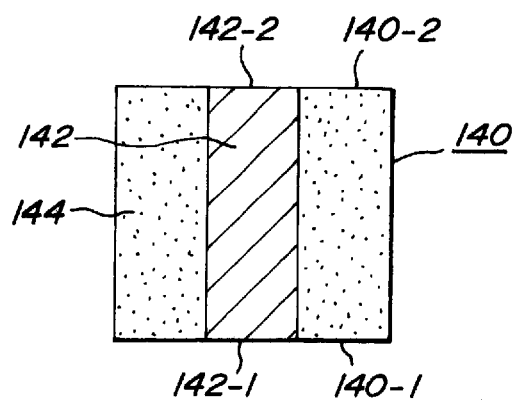
FIG_14
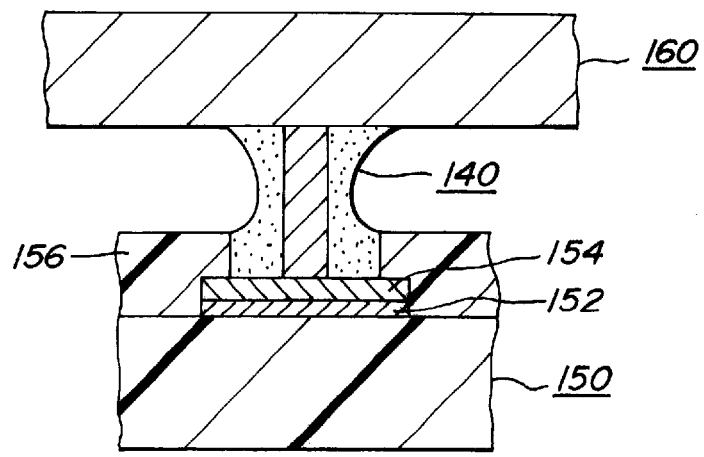

FIG_15
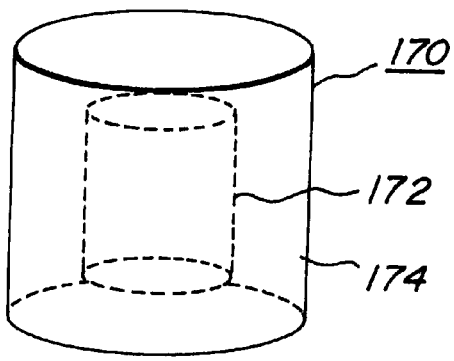
FIG_16
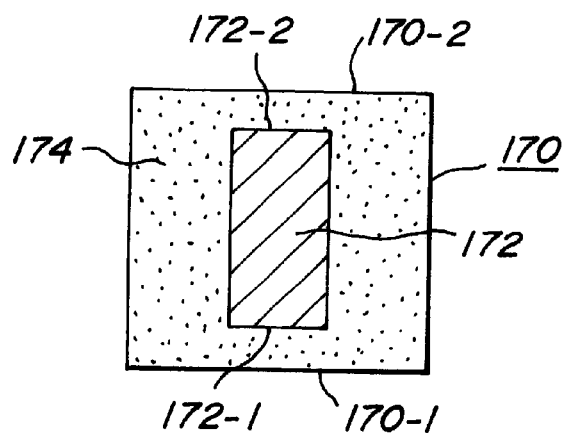
FIG_17
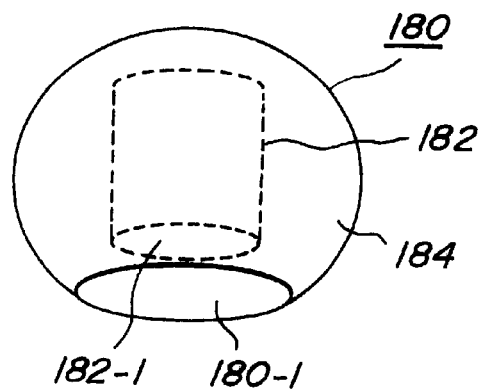

SOLDERING MEMBER FOR PRINTED WIRING BOARDS

TECHNICAL FIELD

This invention relates to a solder member for printed wiring boards, and more particularly to a solder member having an excellent soldered joint strength to a connection terminal of a conductor pattern in a printed wiring board.

BACKGROUND ART

Heretofore, a ball-shaped solder member has mainly been used as a joint member for electrically connecting conductive members of the printed wiring board to each other. And also, the ball-shaped solder member is used for connecting and fixing the printed wiring board to a remote member such as mother board or the like. Such a solder member is a solder ball mainly composed of a solder (Pb—Sn). The solder ball joins to not only the connection terminal of the printed wiring board such as pad, land for through-hole or the like but also the remote member to conduct an electrical connection between the connection terminal and the remote member.

In general, as shown in FIG. 1, the printed wiring board for mounting an electronic part is a substrate 6 to be connected to a mother board 2 through a ball-shaped solder member 4 for external connection. On the substrate 6 are formed connection terminals 8 corresponding to a conductor pattern by etching a copper foil to form a patterned copper layer 9 and then covering a surface of the copper layer 9 with a plated layer 10 formed through an electroless plating process. The plated layer 10 is an electroless Ni/Au plated layer usually formed by electroless Ni plating and electroless Au plating. A ball grid array corresponding to the conductor pattern is formed by disposing a solder member 4 on each of the connection terminals 8.

In the above conventional printed wiring board, however, the joining property between the solder member 4 and the connection terminal 8 is low. Particularly, the joint strength further lowers when the board is held under a high temperature condition over a long time. That is, as shown in FIG. 1, when the solder member 4 is joined to the connection terminal 8 by fusion, tin (Sn) oozes out from the solder onto a surface of the electroless Ni/Au plated layer 10 to thereby form Ni—Sn layer 12 between the solder member 4 and the plated layer 10. Phosphorus (P) included in the electroless Ni plated layer elutes out from the plated layer 10 and rapidly permeates and diffuses into the Ni—Sn layer 12. As a result, a phosphorus concentration in the Ni—Sn layer 12 becomes high and the joint strength between the solder member 4 and the connection terminal 8 lowers to cause the peeling of the solder member from the connection terminal and hence an electrically connection reliability therebetween is degraded. On the other hand, it is considered to remove phosphorus from the electroless Ni plated layer, but in this case, the precipitation of the electroless Ni plated layer becomes ununiform.

DISCLOSURE OF THE INVENTION

In view of the above conventional problems, the invention is to provide a solder member having an excellent soldered joint strength to the connection terminal.

A first aspect of the invention lies in a solder member for external connection joined to a connection terminal formed on a surface of a printed wiring board corresponding to a conductor pattern and having an electroless Ni/Au plated layer, characterized in that the member is comprised of a solder containing finely powdered copper.

In this invention, it is preferable that the solder contains 0.1–20% by weight of copper, and the solder member is a solder ball, and the electroless Ni/Au plated layer contains 3–12% by weight of phosphorus.

A second aspect of the invention lies in a solder member for external connection joined to a connection terminal formed on a surface of a printed wiring board corresponding to a conductor pattern and having an electroless Ni/Au plated layer, characterized in that the member is comprised of a solder containing finely powdered copper and platinum.

In this invention, it is preferable that the solder contains 0.1–20% by weight of copper and 0.01–20% by weight of platinum or further, if necessary, 0.001–5% by weight of gold or 0.01–3% by weight of silicon, and the solder member is a solder ball, and the electroless Ni/Au plated layer contains 3–12% by weight of phosphorus.

A third aspect of the invention lies in a solder member for external connection joined to a connection terminal formed on a surface of a printed wiring board corresponding to a conductor pattern and having an electroless Ni/Au plated layer, characterized in that the member is comprised of a solder containing finely powdered copper and zinc.

In this invention, it is preferable that the solder contains 0.1–20% by weight of copper and 0.01–20% by weight of zinc or further, if necessary, 0.001–3% by weight of iron, and the solder member is a solder ball, and the electroless Ni/Au plated layer contains 3–12% by weight of phosphorus.

A fourth aspect of the invention lies in a solder member for external connection joined to a connection terminal formed on a surface of a printed wiring board corresponding to a conductor pattern and having an electroless Ni/Au plated layer, characterized in that the member is a solder ball consisting of a core made of at least one metal selected from copper, nickel and cobalt and a solder layer covering the metal core.

In this invention, it is preferable that the metal core has a diameter of 100–800 $\mu$m, and the electroless Ni/Au plated layer contains 3–12% by weight of phosphorus.

A fifth aspect of the invention lies in a solder member for external connection joined to a connection terminal formed on a surface of a printed wiring board corresponding to a conductor pattern and having an electroless Ni/Au plated layer, characterized in that the member is comprised of a copper ball, a platinum layer covering the copper ball and a solder layer at least partly covering the platinum layer.

In this invention, it is preferable that the copper ball has a diameter of 100–800 $\mu$m, and the platinum layer has a thickness of 0.05–10 $\mu$m, and the solder layer has a thickness of more than 0 $\mu$m but not more than 150 $\mu$m, and the electroless Ni/Au plated layer contains 3–12% by weight of phosphorus.

A sixth aspect of the invention lies in a solder member for external connection joined to a connection terminal formed on a surface of a printed wiring board corresponding to a conductor pattern and having an electroless Ni/Au plated layer, characterized in that the member is comprised of a column made of at least one metal selected from copper, nickel, palladium, cobalt and platinum and a solder layer at least partly covering a surface of the metal column.

In this invention, it is preferable that the metal column is a cylindrical form and has a diameter corresponding to 60–97% of a diameter of the solder member, and the solder layer is the same face as at least one of two flat faces or both faces of the column located opposite to each other and parallel thereto, and the flat face of the metal column has a smoothness of 10 μm, and the diameter of the metal column is smaller than a width of the connection terminal, and the electroless Ni/Au plated layer contains 3–12% by weight of phosphorus.

BRIEF DESCRIPTION OF THE DRAWINGS

FIG. 2 is a flow diagram illustrating steps of producing an embodiment of the printed wiring board according to the invention.

FIG. 4 is a diagrammatically partial section view of an embodiment of the printed wiring board using the solder member according to the invention.

FIG. 5 is a diagrammatically partial section view of another embodiment of the printed wiring board using the solder member according to the invention.

FIG. 6 is a diagrammatically partial section view of the other embodiment of the printed wiring board using the solder member according to the invention.

FIG. 7 is a diagrammatically partial section view illustrating a joint state between a solder member and a pad of the printed wiring board.

FIG. 8 is a diagrammatically partial section view illustrating a joint state between a solder member and a land of the printed wiring board.

FIG. 9 is a diagrammatically section view of an embodiment of the ball grid array package formed by using the solder member according to the invention.

FIG. 10 is a section view of an embodiment of the solder member according to the invention.

FIG. 12 is a perspective view of an embodiment of the solder member according to the invention.

FIG. 13 is a section view of FIG. 12.

FIG. 14 is a partly section view illustrating a state of joining a printed wiring board to a remote member by using the solder member shown in FIG. 12.

FIG. 15 is a perspective view of another embodiment of the solder member according to the invention.

FIG. 16 is a section view of FIG. 15.

FIG. 17 is a perspective view of the other embodiment of the solder member according to the invention.

BEST MODE FOR CARRYING OUT THE INVENTION

Figure 1:
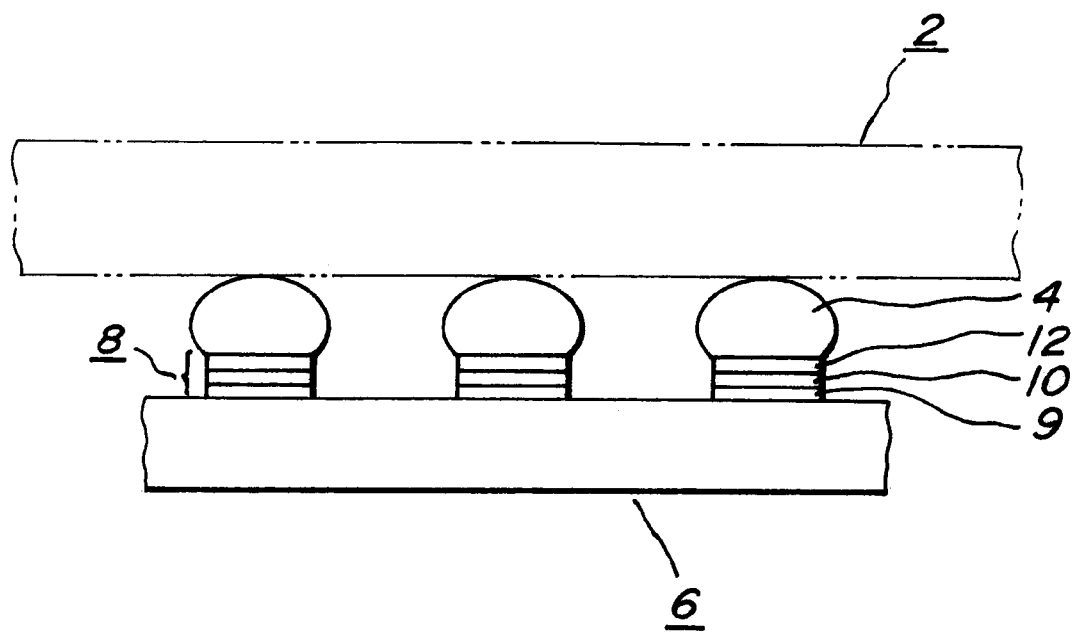
FIG. 1 is a diagrammatically fragmentary view of the conventional printed wiring board.

When a solder member is joined to a connection terminal formed on a copper layer of a conductor pattern and made of an electroless Ni/Au plated layer, a high concentration phosphorus layer resulting in the lowering of the soldered joint strength is formed on an upper layer part of the plated layer as previously mentioned. The inventors have made various studies in order to control the formation of the high concentration phosphorus layer and found that when the solder member is formed by adding finely powdered copper to solder component (Pb—Sn), the formation of high concentration phosphorus layer can be suppressed in the joining to the connection terminal to improve the soldered joint strength to the connection terminal.

That is, in the first aspect of the invention, copper added to the solder component controls the diffusion of phosphorus contained in the electroless plated layer, whereby the thickness of the high concentration phosphorus layer produced at the interface between the solder member and the electroless plated layer can be thinned to control the lowering of the joint strength.

When the copper content in the solder is less than 0.1% by weight or exceeds 20% by weight, there is feared the lowering of the soldered joint strength, so that the copper content is limited to 0.1–20% by weight.

And also, when the solder member is a solder ball, it joins to the connection terminal in the printed wiring board and can play a role as a connection terminal to the remote member.

In the production of such a solder member, Pb and Sn as a solder component and Cu are mixed at a finely powdered state and, if necessary, added with a flux and a tackifier to obtain a pasty or ball-shaped solder. In case of the solder ball, it is preferable to heat the solder at such a temperature that copper diffuses in the solder without completely fusing the ball, e.g. above 200° C. for at least 30 seconds.

On the other hand, copper layer forming the conductor pattern of the printed wiring board is subjected to an electroless nickel plating containing 3–12% by weight of phosphorus and subsequently to an electroless gold plating to form an electroless Ni/Au plated layer thereon. In this case, phosphorus contained in the nickel plated layer enhances the adhesion property between the nickel plated layer and the gold plated layer and makes fast the precipitation rate of gold forming the gold plated layer to improve the joint strength between the solder member and the copper layer as a connection terminal.

When the phosphorus content is less than 3% by weight, the precipitation rate of gold is fast and the wire bonding is possible, but the joint strength between the solder member and the connection terminal in the conductor pattern considerably lowers. This is considered due to the fact that phosphorus does not migrate to the surface of the gold plated layer but retained in the interface between the nickel plated layer and the gold plated layer to form the high concentration phosphorus layer, while Ni—Sn—O alloy layer consisting of nickel migrated from the nickel plated layer, tin migrated from the solder member and oxygen in atmosphere is formed at the interface between the solder member and the connection terminal. On the other hand, when the phosphorus content exceeds 12% by weight, the adhesion property between the nickel plated layer and the gold plated layer becomes high, but the precipitation rate of gold forming the gold plated layer delays to lower the soldered joint strength at room temperature. This is considered due to the fact that the high concentration phosphorus layer is formed in the joining of the solder member. Furthermore, the above alloy layer is easily subjected to an oxidation and there may be caused the lowering of the soldered joint strength in a higher temperature atmosphere. Particularly, in order to further enhance the soldered joint strength between the solder member and the connection terminal, the phosphorus content is preferable to be 5–9% by weight.

Since the nickel/gold layer as a connection terminal is formed by the electroless plating, a lead for electroplating is useless, so that electric noise does not generate and the conductor pattern can be formed more uniformly and hence fine interconnecting can be obtained in a high density.

As the connection terminal of the printed wiring board, there are lead pin, pad for flip chip, pad for TCP and the like. The lead pin is inserted into a through-hole of the printed wiring boar and joined to an inner wall of the through-hole through a solder. The pad for TCP is a tape carrier package. Such a connector terminal is connected to a remote member such as mother board, daughter board, memory module, multichip module, plastic package, semiconductor device, conductor circuit or the like through the solder member to conduct transfer of electricity between the printed wiring board according to the invention and the remote member.

The printed wiring board according to the invention can be produced by covering a full surface of an insulating substrate with a conductor film for wiring (copper), covering portions of the conductor film not forming a conductor pattern with a mask, subjecting portions forming the conductor pattern to electroless nickel plating and electroless gold plating to form an electroless Ni/Au plated layer containing 3–12% by weight of phosphorus, removing the mask, covering the plated layer with another mask, etching the exposed portions of the conductor film to form the conductor pattern, and joining a solder member containing copper to a portion of a connection terminal in the conductor pattern. This production method is concretely described with reference to FIG. 2.

At first, as shown in FIG. 2(a), a conductor film 22 for wiring such s copper foil or the like is disposed on a full surface of an insulating substrate 20 and portions not forming a conductor pattern are covered with a mask 24. Then, as shown in FIG. 2(b), portions forming the conductor pattern are subjected to electroless nickel plating and electroless gold plating to form an electroless Ni/Au plated layer 26. Next, as shown in FIG. 2(c), the mask 24 is removed. Then, as shown in FIG. 2(d), the surface of the plated layer 26 having a shape corresponding to the conductor pattern is covered with another mask 28 having a shape corresponding to the conductor pattern. Next, as shown in FIG. 2(e), the exposed portions of the conductor film 22 are removed by etching to form a copper layer 30 corresponding to the conductor pattern. Thereafter, as shown in FIG. 2(f), the mask 28 is removed to obtain a printed wiring board having the conductor pattern prior to the joining of a solder member. Moreover, the printed wiring board may be produced by conducing an electroplating instead of the electroless plating. In the latter case, the conductor film for wiring may be used as a lead for the electroplating.

In the second aspect of the invention, the solder member is formed by adding finely powdered copper and platinum to the solder component. The addition of copper develops the same effect as in the first aspect of the invention. Since platinum is added in addition to copper, phosphorus in the high concentration phosphorus layer thinly formed by the action of copper is entrapped in the gold plated layer by the action of platinum, so that the high concentration phosphorus layer is not substantially formed and hence the soldered joint strength can be further enhanced as compared with the case of adding only copper.

The platinum content is 0.01–20% by weight, preferably 2–15% by weight. When the platinum content is less than 0.01% by weight or exceeds 20% by weight, there is a fear of lowering the soldered joint strength.

The solder member may contain 0.001–5% by weight of gold in addition to copper and platinum. In this case, gold can more effectively control the diffusion of component in the connection terminal of the conductor pattern into the solder member. When the gold content is outside the above range, the above function of gold can not effectively be developed and also there is a fear of lowering the soldered joint strength to the connection terminal.

Furthermore, the solder member may contain 0.01–3% by weight of silicon instead of gold. In this case, silicon bonds to phosphorus migrated from the nickel plated layer to thereby control the formation of the high concentration phosphorus layer and hence the joint strength to the connection terminal can be further enhanced. Moreover, when copper is not existent and only platinum is existent in the solder member, even if silicon is added, the improvement of the joint strength to the connection terminal is not obtained. However, when a given amount of silicon is added in the co-existence of copper and platinum, the soldered joint strength is considerably improved as mentioned above.

The solder member and the printed wiring board according to the second aspect of the invention can be produced in the same manner as in the first aspect of the invention.

In the third aspect of the invention, the solder member is formed by adding finely powdered copper and zinc to the solder component. The addition of copper develops the same effect as in the first aspect of the invention. Since zinc is added in addition to copper, phosphorus in the high concentration phosphorus layer thinly formed by the action of copper is entrapped in the gold plated layer by the action of zinc, so that the high concentration phosphorus layer is not substantially formed and hence the soldered joint strength can be further enhanced as compared with the case of adding only copper.

The zinc content is 0.01–20% by weight, preferably 2–15% by weight. When the zinc content is less than 0.01% by weight or exceeds 20% by weight, there is a fear of lowering the soldered joint strength.

The solder member may contain 0.001–3% by weight of iron in addition to copper and platinum. In this case, iron can more effectively control the diffusion of component in the connection terminal of the conductor pattern into the solder member. When the iron content is outside the above range, the above function of iron can not effectively be developed and also there is a fear of lowering the soldered joint strength to the connection terminal.

The solder member and the printed wiring board according to the third aspect of the invention can be produced in the same manner as in the first aspect of the invention.

In the fourth aspect of the invention, the solder member is a solder ball consisting of a core made of at least one metal selected from copper, nickel and cobalt and a solder layer covering the metal core. In this case, the metal core effectively prevents the elution of tin contained in the solder layer to control the formation of Ni—Sn alloy and also controls the diffusion of phosphorus contained in the electroless Ni/Au plated layer of the connection terminal into Ni—Sn alloy, whereby the breakage between the solder member and the connection terminal can be suppressed to prevent the lowering of the soldered joint strength.

The metal core is preferable to have a diameter of 100–800 µm. When the diameter is outside the above range, there is a fear of lowering the joint strength of the solder ball.

Such a solder ball cam be produced by covering the metal core with the solder component through, for example, a dipping method in a solder bath, a plating method or the like. Moreover, the solder member and the printed wiring board according to the fourth aspect of the invention can be produced in the same manner as in the first aspect of the invention.

In the fifth aspect of the invention, the solder member is comprised of a copper ball, a platinum layer covering the copper ball and a solder layer at least partly covering the platinum layer. In this case, components in the copper ball and the platinum layer diffuse into the solder layer to form Pb—Sn—Cu—Pt alloy layer in the vicinity of the surface of the solder member, so that the joint strength to the connection terminal is improved through such an alloy layer.

The copper ball is preferable to have a diameter of 100–800 μm. When the diameter is outside the above range, there is a fear of lowering the joint strength of the solder ball. Furthermore, the platinum layer is favorable to have a thickness of 0.05–10 μm. When the thickness of the platinum layer is outside the above range, there is a fear of lowering the joint strength of the solder ball. On the other hand, the solder layer is preferable to have a thickness of more than 0 μm but not more than 150 μm. When the thickness of the solder layer is outside the above range, there is a fear of lowering the joint strength of the solder ball.

The platinum layer is formed on the copper ball by plating method or immersion method. The thickness of the platinum layer is adjusted to a desired value by plating current, concentration and the like in case of the plating method, or by concentration in solution and the like in case of the immersion method.

Moreover, the printed wiring board according to the fifth aspect of the invention can be produced in the same manner as in the first aspect of the invention.

In the sixth aspect of the invention, the solder member is comprised of a column made of at least one metal selected from copper, nickel, palladium, cobalt and platinum and a solder layer at least partly covering the surface of the metal column. In this case, a part of the metal constituting the metal column diffuses into the solder component, but hardly fuses at a melting point of the solder layer, so that the solder member can stably hold the printed wiring board and the remote member at a distance corresponding to the height of the metal column. Particularly, when the metal column is a cylindrical form and the solder layer is the same face as at least one of two flat faces or both faces of the column located opposite to each other and parallel thereto, since the flat face of the cylindrical column contacts with the connection terminal as compared with a point contact of the solder member comprised of the metal core to the connection terminal, mechanical stress and thermal stress can be dispersed and hence the connection reliability of the solder member to the printed wiring board and/or the remote member becomes considerably high. Furthermore, a part of the metal component constituting the metal column diffuses into the solder component to improve the soldered joint strength to the connection terminal.

The metal column has a diameter corresponding to 60–97% of the diameter of the solder member. When the diameter is less than 60%, the connection reliability to the connection terminal of the printed wiring board and the remote member may not be maintained for a long time, while when it exceeds 97%, an initial joint strength may not be obtained. Further, it is favorable that the flat face of the metal column has a smoothness of 10 μm, and the diameter of the metal column is smaller than a width of the connection terminal. Thus, the solder member can stably and surely be joined to the connection terminal.

Figure 3:
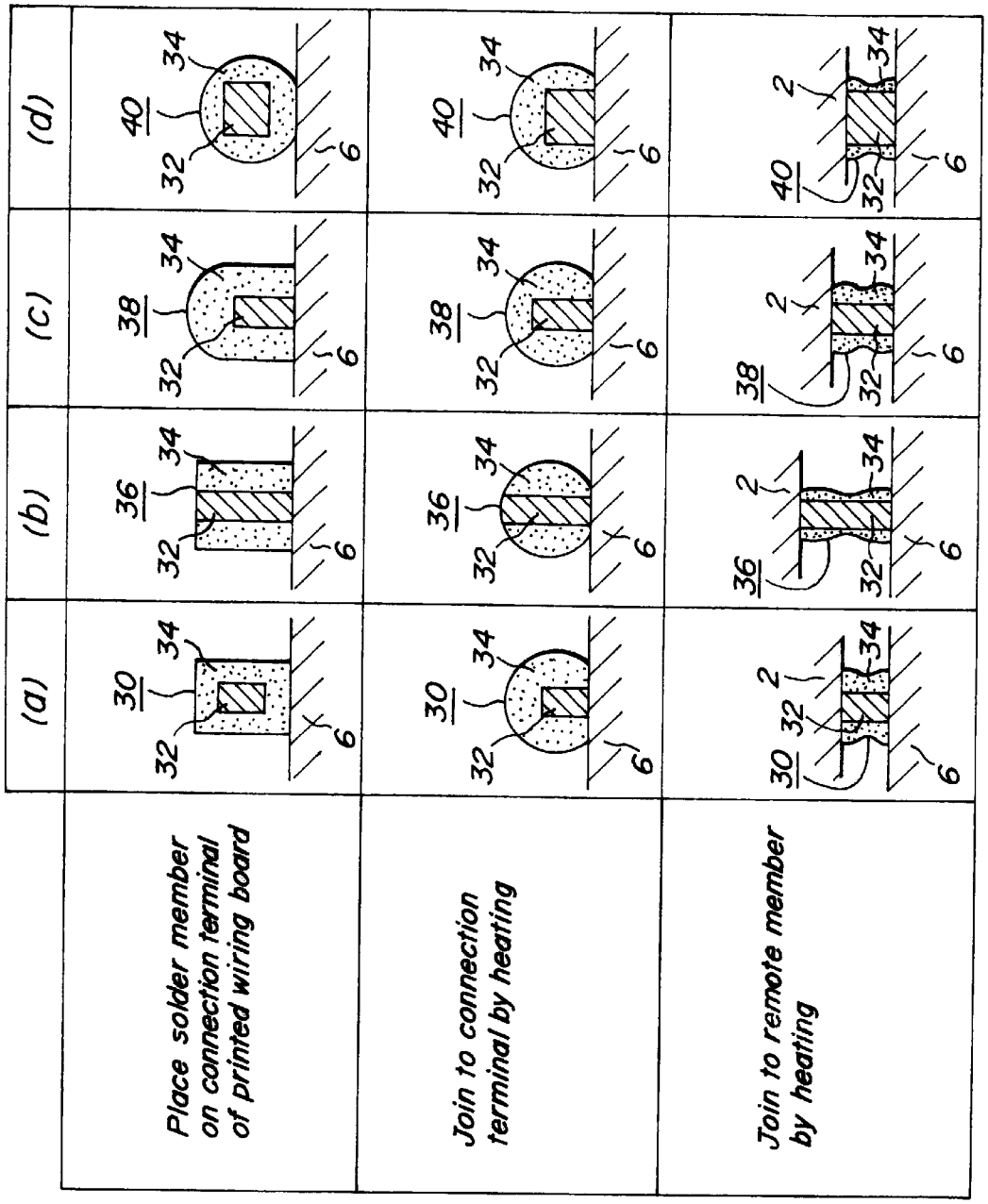
FIG. 3 is a section view illustrating some structure examples of the solder member according to the invention.

As the solder member according to the sixth aspect of the invention, there are structures shown in an upper row of FIG. 3. A solder member 30 shown in FIG. 3(a) is a cylindrical column formed by covering a full face of a cylindrical metal column 32 with a solder layer 34, and a solder member 36 shown in FIG. 3(b) is a cylindrical column formed by covering only a side face of the metal column 32 with the solder layer 34 so that the upper and lower faces of the metal column 32 are the same as the upper and lower faces of the solder layer 34, and a solder member 38 shown in FIG. 3(c) is a cap-shaped cylindrical column formed by covering side face and upper face of the metal column 32 with the solder layer 34 so that a lower face of the metal column 32 is the same as a lower face of the solder layer 34, and a solder member 40 shown in FIG. 3(d) is an approximately spherical body formed by covering a full face of the metal column 32 with the solder layer 34.

When each of the solder members shown in the upper row of FIG. 3 is placed on a connection terminal of a printed wiling board 6 and hen heated, as shown in a middle row of FIG. 3, the solder layer 34 is melted and a part thereof is flown out onto a surface of the connection terminal and joined thereto. Then, when a remote member 2 is placed on the solder member and again heated, as shown in a lower row of FIG. 3, a part of the solder layer 34 is melted and flow out onto a surface of the remote member 2 and joined thereto.

Moreover, the printed wiring board according to the sixth aspect of the invention can be produced in the same manner as in the first aspect of the invention.

In all aspects of the invention, the solder member ca be joined to the printed wiring board and/or the remote member by heating and melting the solder layer and it is not required to previously apply a solder paste to the surface of the connection terminal, so that the production step can be simplified.

The following examples are given in illustration of the invention and are not intended as limitations thereof.

EXAMPLE 1

In this example, the production of a printed wiring board using a solder member comprised of a solder containing copper is described with reference to FIG. 2 and FIG. 4.

As shown in FIG. 4, the printed wiring board 6 of this example has connection terminals or so-called pads 44 solder-joined with a solder member 42 for external connection. The pad 44 is a part of a conductor pattern of the wiring board and is comprised of a copper layer 30 and an electroless Ni/Au plated layer 26. On the other hand, a top of the solder member 42 is joined to a remote member, for example, a pad of a mother board as shown in FIG. 1.

In the production of the printed wiring board, as shown in FIG. 2, there is first provided an insulating substrate 20 made from epoxy resin, polyimide resin or bismaleimide triazine and a glass cloth or glass fiber and a copper foil 22 as a conductor for wiring is adhered thereonto. Then, a copper layer 30 corresponding to a conductor pattern is formed by etching the copper foil, and thereafter the surface of the patterned copper layer 30 is subjected to an electroless plating to form a plated layer consisting of nickel layer 26-1 and gold layer 26-2 as a pad 44. In this case, the thickness of the nickel layer is 0.1–30 μm, and the thickness of the gold layer is 0.01–10 μm.

Separately, finely powdered copper is uniformly dispersed into a solder component (Pb—Sn) to obtain a ball-shaped solder member 42. The solder member 42 is placed on the pad 44 and joined to the pad by heating and melting at 200° C. for 30 seconds. In this case, Sn—Ni alloy layer and high concentration P layer containing Sn, Cu migrated from the solder member and Ni, P migrated from the nickel layer are formed in the gold layer.

In the thus produced printed wiring board, a relation of the solder member, component in the nickel layer and joint strength of the solder member is examined.

Samples 1, 2 (invention products) are produced by varying copper content in the solder member and phosphorus content in the nickel layer while in samples C1, C2 (comparative example), the solder component is constant as 37% by weight Pb—63% by weight Sn.

There are measured initial joint strength, joint strength after the heating at 125° C. for 100 hours, and thickness of Sn—Ni alloy layer and thickness of high concentration P layer in the gold layer after the joining in each of these samples. The results are shown in Table 1.

TABLE 1

| Sample | | 1 | 2 | C1 | C2 |
|---|---|---|---|---|---|
| Ball-shaped solder member (wt %) | Pb—Sn | 36.7~62.4 | 35.5~60 | 37~63 | 37~63 |
| | Cu | 0.9 | 4.5 | 0 | 0 |
| Nickel layer (wt %) | Ni | 93 | 88 | 93 | 100 |
| | P | 7 | 12 | 7 | 0 |
| Initial joint strength (per ball) (kg) | | 1.7 | 1.7 | 1.1 | 1.6 |
| Joint strength after heating (per ball) (kg) | | 1.5 | 1.4 | 0.5 | 1.3 |
| Thickness of Sn—Ni alloy layer ($\mu$m) | | 0.8 | 1.5 | 5.1 | 1.2 |
| Thickness of high concentration P layer ($\mu$m) | | 0.05 | 0.1 | 0.6 | 0 |

As seen from the results of Table 1, the samples 1, 2 are high in the joint strength as compared with the samples C1, C2. And also, the sample C1 having phosphorus-containing nickel layer is low in the joint strength as compared with the sample C2 provided with nickel layer containing no phosphorus. That is, when phosphorus is existent in the nickel layer, the formation of the high concentration phosphorus layer is controlled by adding copper to the solder component to enhance the joint strength to the connection terminal.

EXAMPLE 2

In this example, as shown in FIG. 5, a bonding wire 46 is solder-joined to the pad 44 of the printed wiring board 6 of Example 1 through the solder member 42.

The bonding wire 46 electrically connects a semiconductor device (not shown) mounted on the printed wiring board 6 to the pad 44. The same effect as in Example 1 can be obtained by using the solder member of Example 1.

EXAMPLE 3

In this example, the solder member 42 shown in FIG. 4 is a solder ball formed by adding copper, platinum and gold to the solder component. In this case, copper is varied within a range of 0.1–15% by weight, and platinum is varied within a range of 0.01–2% by weight, and gold is varied within a range of 0.001–1% by weight, while in the remaining solder, lead is varied within a range of 10–70% by weight and tin is varied within a range of 30–90% by weight. Such a solder ball is obtained by mixing a given amount of each component with a flux and a tackifier and shaping the resulting paste into a ball.

The same effect as in Example 1 can be obtained by using this solder member.

EXAMPLE 4

In this example, there is examined a relation of solder member, component of nickel layer and joint strength of solder member in the printed wiring board shown in FIG. 4.

Samples 3–7 (invention products) and samples C3–C5 (comparative example) are produced by varying Cu, Pt and Si contents in the ball-shaped solder member and phosphorus content in the nickel layer, while the samples C1, C2 (comparative example) have constant solder component of 37% by weight Pb—63% by weight Sn.

There are measured initial joint strength, joint strength after the heating at 125° C. for 100 hours, and thickness of Sn—Ni alloy layer and thickness of high concentration P layer in the gold layer after the joining in each of these samples. The results are shown in Table 2.

TABLE 2

| | | Sample | | | | | | | | | |
|---|---|---|---|---|---|---|---|---|---|---|---|
| | | 3 | 4 | C3 | C4 | 5 | 6 | C5 | 7 | C1 | C2 |
| Ball-shaped solder member (wt %) | Pb—Sn | 31~52 | 31~52 | 33~55 | 34.5~58.5 | 30~50 | 8~72 | 31.5~53.5 | 31~52 | 37~63 | 37~63 |
| | Cu | 10 | 15 | 10 | 0 | 5 | 5 | 0 | 10 | 0 | 0 |
| | Pt | 5 | 2 | 0 | 5 | 15 | 15 | 15 | 5 | 0 | 0 |
| | Si | 2 | 0 | 2 | 2 | 0 | 0 | 0 | 2 | 0 | 0 |
| Nickel layer (wt %) | Ni | 93 | 93 | 93 | 93 | 93 | 93 | 93 | 88 | 93 | 100 |
| | P | 7 | 7 | 7 | 7 | 7 | 7 | 7 | 12 | 7 | 0 |
| Initial joint strength (per ball) (kg) | | 1.6 | 1.7 | 1.6 | 1.3 | 1.3 | 1.6 | 1.3 | 1.6 | 1.1 | 1.6 |
| Joint strength after heating (per ball) (kg) | | 1.4 | 1.3 | 1.1 | 0.7 | 1.2 | 1.3 | 0.8 | 1.1 | 0.5 | 1.3 |
| Thickness of Sn—Ni alloy layer ($\mu$m) | | 1.8 | 1.5 | 1.8 | 3.8 | 2 | 2.3 | 3.9 | 2.3 | 5.1 | 1.2 |
| Thickness of high concentration P layer ($\mu$m) | | <0.1 | <0.1 | <0.1 | 0.6 | 0.3 | 0.33 | 0.6 | 0.3 | 0.6 | 0 |

As seen from the results of Table 2, the samples 3–7 are high in the joint strength as compared with the samples C1, C2. On the other hand, the sample C3 considerably degrades the joint strength after the heating because platinum is not included, while the samples C4, C5 can not control the formation of the high concentration phosphorus layer because copper is not included, and are low in the joint strength.

The same effect as in Example 2 is obtained by applying the solder member to the printed wiring board shown in FIG. 5.

EXAMPLE 5

In this example, there is examined a relation of solder member, component of nickel layer and joint strength of solder member in the printed wiring board shown in FIG. 4.

The solder member 42 is a solder ball formed by adding copper, zinc and iron to the solder component.

Samples 8–12 (invention products) and samples C6–C8 (comparative example) are produced by varying Cu, Zn and Fe contents in the ball-shaped solder member and phosphorus content in the nickel layer, while the samples C1, C2 (comparative example) have constant solder component of 37% by weight Pb—63% by weight Sn.

There are measured initial joint strength, joint strength after the heating at 125° C. for 100 hours, and thickness of high concentration P layer in the gold layer after the joining in each of these samples. The results are shown in Table 3.

7 or a land 62 formed around a via-hole 60 as shown in FIG. 8 as the connection terminal, the same effect as mentioned above is obtained.

An embodiment of the ball grid array package provided with a ball grid array formed by using a solder member as described in the aforementioned examples and the following examples is shown in FIG. 9.

The ball grid array package 70 is a multilayer board formed by laminating plural glass-epoxy insulating substrates 72 through prepreg adhesive layers 74. Lands 78 for

TABLE 3

| | | \multicolumn{10}{c}{Sample} |
|---|---|---|---|---|---|---|---|---|---|---|---|
| | | 8 | 9 | C6 | C7 | 10 | 11 | C8 | 12 | C1 | C2 |
| Ball-shaped solder member (wt %) | Pb—Sn | 31~52 | 31~52 | 33~55 | 34.5~58.5 | 30~50 | 8~72 | 31.5~53.5 | 31~52 | 37~63 | 37~63 |
| | Cu | 10 | 15 | 10 | 0 | 5 | 5 | 0 | 10 | 0 | 0 |
| | Zn | 5 | 2 | 0 | 5 | 15 | 15 | 15 | 5 | 0 | 0 |
| | Fe | 2 | 0 | 2 | 2 | 0 | 0 | 0 | 2 | 0 | 0 |
| Nickel layer (wt %) | Ni | 93 | 93 | 93 | 93 | 93 | 93 | 93 | 88 | 93 | 100 |
| | P | 7 | 7 | 7 | 7 | 7 | 7 | 7 | 12 | 7 | 0 |
| Initial joint strength (per ball) (kg) | | 1.65 | 1.55 | 1.30 | 1.45 | 1.60 | 1.70 | 1.48 | 1.68 | 1.10 | 1.60 |
| Joint strength after heating (per ball) (kg) | | 1.28 | 1.10 | 0.80 | 0.90 | 1.30 | 1.31 | 0.70 | 1.35 | 0.50 | 1.30 |
| Thickness of high concentration P layer ($\mu$m) | | 1.8 | 2.3 | 3.6 | 3.3 | 1.5 | 0.9 | 3.1 | 1.5 | 0.6 | 0 |

As seen from the results of Table 3, the samples 8–12 are high in the joint strength as compared with the samples C1, C2. On the other hand, the samples C6–C8 can not control the formation of the high concentration phosphorus layer because either of copper and zinc is not included, and are low in the joint strength.

The same effect as in Example 2 is obtained by applying the solder member to the printed wiring board shown in FIG. 5.

EXAMPLE 6

In this example, a ball-shaped solder member 50 is joined to a connection terminal 44 of a printed wiring board 6 produced at steps of FIG. 2.

The connection terminal 44 is comprised of a copper layer 30 formed on an insulating substrate 20 in correspondence with a conductor pattern and a phosphorus-containing electroless Ni/Au plated layer 26 formed thereon by electroless plating.

The solder member 50 is a solder ball formed by immersing a copper ball 52 as a metal core in a molten solder bath to cover the surface thereof with a solder layer 54. In this case, the diameter of the copper ball 52 is 600 $\mu$m and the covering thickness of the solder layer 54 is 80 $\mu$m.

When the solder ball 50 is placed on the connection terminal 44 and melted by heating, Ni—Sn alloy layer 56 is formed in an interface therebetween, but copper component migrates from the solder ball into the alloy layer to suppress the diffusion of phosphorus contained in the plated layer into the alloy layer, whereby the formation of high concentration phosphorus layer is prevented and the breakage between the solder ball and the connection terminal can be suppressed to prevent the lowering of the joint strength.

The same effect as mentioned above is obtained even when nickel ball or cobalt ball is used as a metal core instead of the copper ball.

Even when the solder ball 50 is applied to a pad 58 formed on the surface of the insulating substrate 20 as shown in FIG.

via-holes 76, pads 80, interconnecting circuits 82 and bonding pads 84 are formed on the surface of the multilayer board, each of which serves as a connection terminal and is comprised of a copper layer and an electroless Ni/Au plated layer. And also, an inner wall of each via-hole 76 is covered with a metal plated film 86 and also a solder 88 is filled therein.

In an approximately center of the multilayer board is formed a concave mount portion 90 for mounting an electronic part 92. The electronic part 92 is joined to the bottom of the mount portion 90 through an adhesive layer 94 such as a silver paste or the like, and electrically connected to the bonding pad 84 through a bonding wire 96, and protected with a sealing resin 98.

On the bottom side of the mount portion 90 is adhered a heat sink 100 through a adhesive layer 102.

The ball grid array is formed by joining the solder member 104 described in each example to each of the above connection terminals, which is joined by melting to the respective terminal 108 of a mother board 106, whereby the ball grid array 70 is mounted onto the mother board 106.

EXAMPLE 7

In this example, there is produced a ball-shaped solder member 110 shown in FIG. 10.

At first, a platinum layer 114 is formed on a surface of a copper ball having a diameter of 100–800 $\mu$m by a plating method. The thickness of the platinum layer 114 is adjusted to a given value within a range of 0.05–10 (by controlling a plating current and a platinum concentration.

Then, a solder layer 116 is formed on the surface of the platinum layer 114 by anyone of molten solder immersion method, solder plating method, solder paste application method and the like. The thickness of the solder layer 116 is adjusted to a given value within a range of more than 0 $\mu$m but not more than 150 $\mu$m by controlling the immersion time in case of the molten solder immersion method, plating current and solder concentration in case of the solder plating method, and paste concentration and application quantity in case of the solder paste method.

Figure 11:
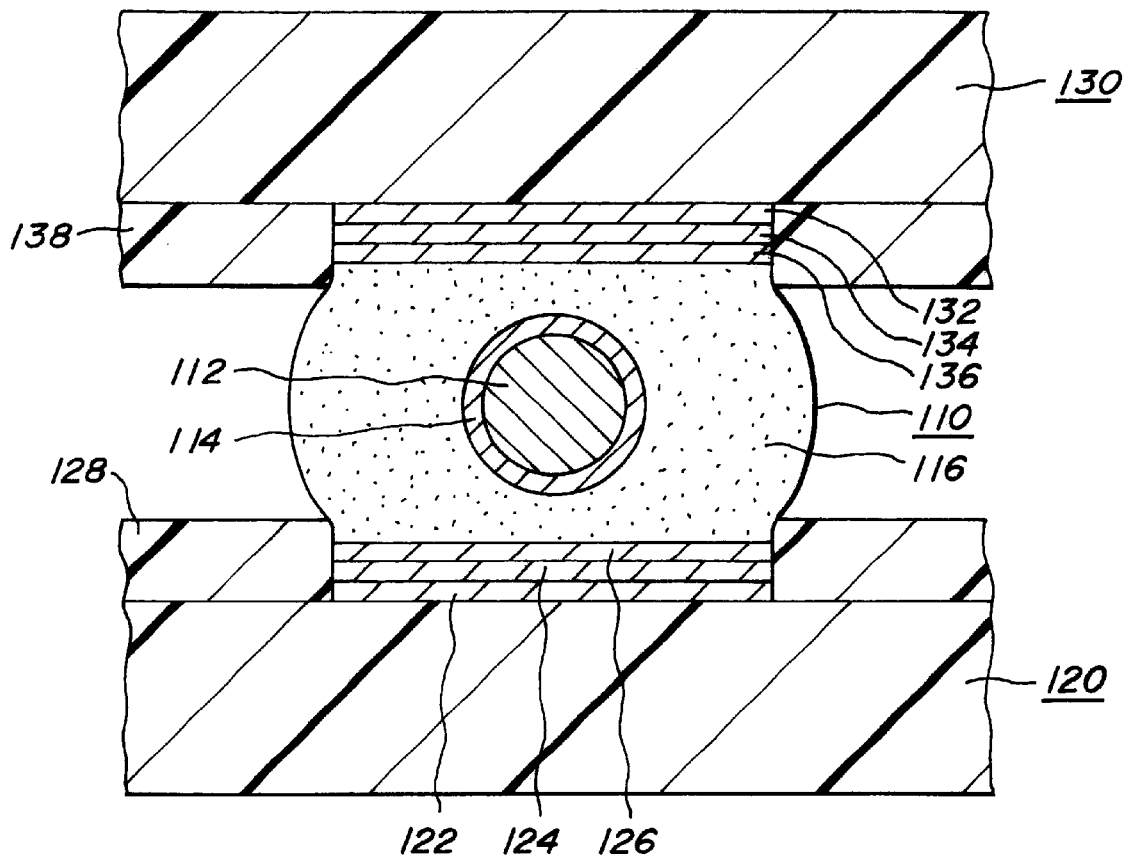
FIG. 11 is a diagrammatically partial section view illustrating a state of joining a printed wiring board to a mother board by using the solder member of FIG. 10.

By using the thus formed solder member 110 are joined a printed wiring board 120 and a mother board 130 as shown in FIG. 11. In this case, the solder member 110 is fed onto a pad having a three layer structure comprised of a copper layer 122, an electroless nickel plated layer 124 containing phosphorus and an electroless gold plated layer 126 as a connection terminal formed on the printed wiring board 120 in correspondence with a conductor pattern and joined to the pad by heating at a given temperature for a given time. Then, a pad formed in the mother board 130 and comprised of a copper layer 132, a nickel plated layer 134 and a gold plated layer 136 is joined to a head portion of the solder member 110 by heating and melting the solder member. Thus, pad of the printed wiring board 120 is electrically connected to the pad of the mother board 130 through the solder member 110.

Moreover, 128 and 138 are solder resists, respectively.

When the solder member 110 is melted by heating, components of the copper ball 112 and the platinum layer 114 diffuse into the solder layer 116 to form Pb—Sn—Cu—Pt alloy layer in the vicinity of the surface of the solder member, whereby the migration of phosphorus from the nickel plated layer is suppressed to improve the joint strength to each pad.

Moreover, the same effect as mentioned above is obtained eve when a ball comprised of copper ball and platinum layer is placed on a solder layer formed on the pad and partly covered therewith by heating and melting the solder layer to form a solder member. In this case, the similar effect is obtained even when the platinum layer covering the copper ball is formed in only a position contacting with the solder layer.

EXAMPLE 8

In this example, there is produced a solder member for joining to a connection terminal of a printed wiring board as shown in FIG. 12 and FIG. 13.

This solder member 140 is a cylindrical body and is comprised of a cylindrical metal column 142 and a solder layer 144 partly covering the surface of the metal column 142. The solder member 140 has two flat faces wherein the two flat faces are formed at positions opposite to each other. That is, bottom 140-1 and top 140-2 of the solder member 140 are the same as bottom 142-1 and top 142-2 of the metal column 142. Therefore, the solder member 140 is a cylindrical column having the same central axis as a central axis of the metal column 142.

As the metal column 142 is used a copper column having a diameter corresponding to 70% of the diameter of the solder member. The similar effect is obtained by using nickel, palladium, cobalt and platinum instead of copper. The solder layer 144 consists essentially of a solder (Pb—Sn). The copper column is covered with the solder by a solder plating method, a dipping method in a molten solder bath or the like and then cut into a given length by using a laser or the like to form the solder member 140.

By using the thus formed solder member 140 are joined a printed wiring board 150 and a mother board 160 as shown in FIG. 14. In this case, the solder member 140 is fed onto a pad having a two layer structure comprised of a copper layer 152 and a phosphorus-containing electroless nickel/gold plated layer 154 as a connection terminal formed on the printed wiring board 150 in correspondence with a conductor pattern and joined to the pad by heating and melting at a given temperature for a given time. Then, a pad located at a given position of the mother board 150 is joined to a head portion of the solder member 140 by heating and melting the solder member. Thus, the pad of the printed wiring board 150 is electrically connected to the pad of the mother board 160 through the solder member 140 at a state of maintaining a constant distance corresponding to the height of the metal column 142. Moreover, 156 is a solder resist.

The solder member 140 can directly be joined to the printed wiring board and the mother board by heating and melting the solder layer 144, so that it is not necessary to previously apply a solder paste to the connection terminal and the production steps can be simplified.

EXAMPLE 9

In this example, there is produced a solder member for joining to a connection terminal of a printed wiring board as shown in FIG. 15 and FIG. 16.

This solder member 170 is a cylindrical column and is comprised of a cylindrical metal column 172 and a solder layer 174 covering a full surface of the metal column 172. In this case, bottom 170-1 and top 170-2 of the solder member 170 are positioned in parallel to bottom 172-1 and top 172-2 of the metal column 172, respectively.

As the metal column 172 is used a copper column having a diameter corresponding to 80% of the diameter of the solder member. The similar effect is obtained by using nickel, palladium, cobalt and platinum instead of copper. The solder layer 144 consists essentially of a solder (Pb—Sn). The copper column is covered with the solder by a solder plating method, a dipping method in a molten solder bath or the like and then cut into a given length by using a laser or the like to form the solder member 170.

EXAMPLE 10

In this example, there is produced a solder member for joining to a connection terminal of a printed wiring board as shown in FIG. 17.

This solder member 180 is comprised of a cylindrical metal column 182 and an approximately ball-shaped solder layer 184 covering the full surface of the metal column 182. In this case, the bottom 180-1 of the solder member 180 is flat and is positioned in parallel to the bottom 182-1 of the metal column 182.

As the metal column 182 is used a copper column having a diameter corresponding to 65% of the diameter of the solder member. The similar effect is obtained even when nickel, palladium, cobalt and platinum are used instead of copper. The solder layer 184 consists essentially of a solder (Pb—Sn). The solder member 180 is formed by covering the whole of the copper column with the solder through a solder plating method, a dipping method in molten solder bath or the like.

When the printed wiring board and the mother board are joined by using the solder member 180, the same effect as in Example 8 is obtained.

INDUSTRIAL APPLICABILITY

According to the invention, there can be provided solder members being easy in reflow joint to the connection terminal and having an excellent joint strength, and also there can be provided a printed wiring board having an excellent soldered joint strength to the connection terminal using the above solder member.

What is claimed is:

1. A solder member for external connection: wherein said solder member is joined to a connection terminal formed on a surface of a printed wiring board corresponding to a conductor pattern and having an electroless Ni/Au plated layer, wherein the solder member comprises:

an Sn—Pb based alloy comprising finely powdered copper, platinum and silicon.

2. A solder member according to claim 1, wherein the solder contains 0.1–20% by weight of copper, 0.01–20% by weight of platinum and 0.01–3% by weight of silicon.

3. A solder member for external connection: wherein said solder member is joined to a connection terminal formed on a surface of a printed wiring board corresponding to a conductor pattern and having an electroless Ni/Au plated layer, the solder member comprises:

an Sn—Pb based alloy comprising finely powdered copper, zinc and iron.

4. A solder member according to claim 3, wherein the solder contains 0.1–20% by weight of copper, 0.01–20% by weight of zinc and 0.001–3% by weight of iron.

* * * * *